(12) United States Patent
Holland et al.

(10) Patent No.: US 11,553,624 B1
(45) Date of Patent: Jan. 10, 2023

(54) INTEGRATED THERMAL INTERFACE DETACHMENT MECHANISM FOR INACCESSIBLE INTERFACES

(71) Applicant: Lenovo (Singapore) Ptd. Ltd., Singapore (CN)

(72) Inventors: Jeffrey Scott Holland, Research Triangle Park, NC (US); James Robert Drake, Research Triangle Park, NC (US)

(73) Assignee: Lenovo (United States) Inc., Morrisville, NC (US)

( * ) Notice: Subject to any disclaimer, the term of this patent is extended or adjusted under 35 U.S.C. 154(b) by 66 days.

(21) Appl. No.: 17/355,885

(22) Filed: Jun. 23, 2021

(51) Int. Cl.
*H05K 7/20* (2006.01)
*H01L 23/40* (2006.01)

(52) U.S. Cl.
CPC ..... *H05K 7/20509* (2013.01); *H05K 7/20454* (2013.01); *H01L 23/4006* (2013.01)

(58) Field of Classification Search
CPC .......... H05K 7/20454; H05K 7/20472–20481; H05K 7/20509; H05K 7/20854; H05K 7/209; H05K 7/20963; H01L 23/40–4006
See application file for complete search history.

(56) References Cited

U.S. PATENT DOCUMENTS

| | | | |
|---|---|---|---|
| 6,597,575 B1* | 7/2003 | Matayabas, Jr. | .... H01L 23/3737 361/708 |
| 7,663,227 B2* | 2/2010 | Macris | .................... H01L 23/10 257/E23.109 |
| 11,061,319 B2* | 7/2021 | Kosaka | ..................... G03F 1/38 |
| 2005/0061496 A1* | 3/2005 | Matabayas, Jr. | ....... B82Y 10/00 165/185 |
| 2019/0304871 A1* | 10/2019 | Laido | .................. H01L 23/4093 |

* cited by examiner

*Primary Examiner* — Zachary Pape
(74) *Attorney, Agent, or Firm* — Olive Law Group, PLLC

(57) ABSTRACT

Integrated Thermal Interface Detachment Mechanism for Inaccessible Interfaces are disclosed. According to an aspect, an exemplary device for an electronic component having a thermal interface material, comprising a heat sink configured to contact the thermal interface material and configured to heat transfer interface with the electronic component while the thermal interface material is in contiguous contact with both the heat sink and the electronic component, and a separator mechanism configured to advance a separator ram with respect to the heat sink and effect a force upon the thermal interface material, such that advancing the ram breaks the contiguous contact of the thermal interface material with at least one of the heat sink and the electronic component.

19 Claims, 13 Drawing Sheets

INTEGRATED THERMAL INTERFACE DETACHMENT MECHANISM FOR INACCESSIBLE INTERFACES

TECHNICAL FIELD

The presently disclosed subject matter relates generally to installation and servicing and detachment of electronic components cooled with a heat sink and comprising a thermal interface material cooled with a heat sink. Particularly, the presently disclosed subject matter relates to Mechanical, Thermal, Human Factors of installation and servicing electronic components and cooling devices.

SUMMARY

The presently disclosed subject matter is directed to device and method embodiments of an Integrated Thermal Interface Detachment Mechanism for Inaccessible Interfaces.

According to an aspect, an exemplary device for an electronic component having a thermal interface material, comprising a heat sink configured to contact the thermal interface material and configured to heat transfer interface with the electronic component while the thermal interface material is in contiguous contact with both the heat sink and the electronic component, and a separator mechanism configured to advance a separator ram with respect to the heat sink and effect a force upon the thermal interface material, such that advancing the ram breaks the contiguous contact of the thermal interface material with at least one of the heat sink and the electronic component.

According to a further aspect, an exemplary method for breaking a thermal interface with an electronic component having a thermal interface material, comprising advancing a separator ram of a separator mechanism of a heat sink in contact with the thermal interface material and configured to thermal interface with the electronic component while the thermal interface material is in contiguous contact with both the heat sink and the electronic component, effecting a force upon the thermal interface material with the ram, and breaking the contiguous contact of the thermal interface material with at least one of the heat sink and the electronic component, such that the heat sink is no longer in thermal interface with the electronic component.

BRIEF DESCRIPTION OF THE DRAWINGS

Figure 1:
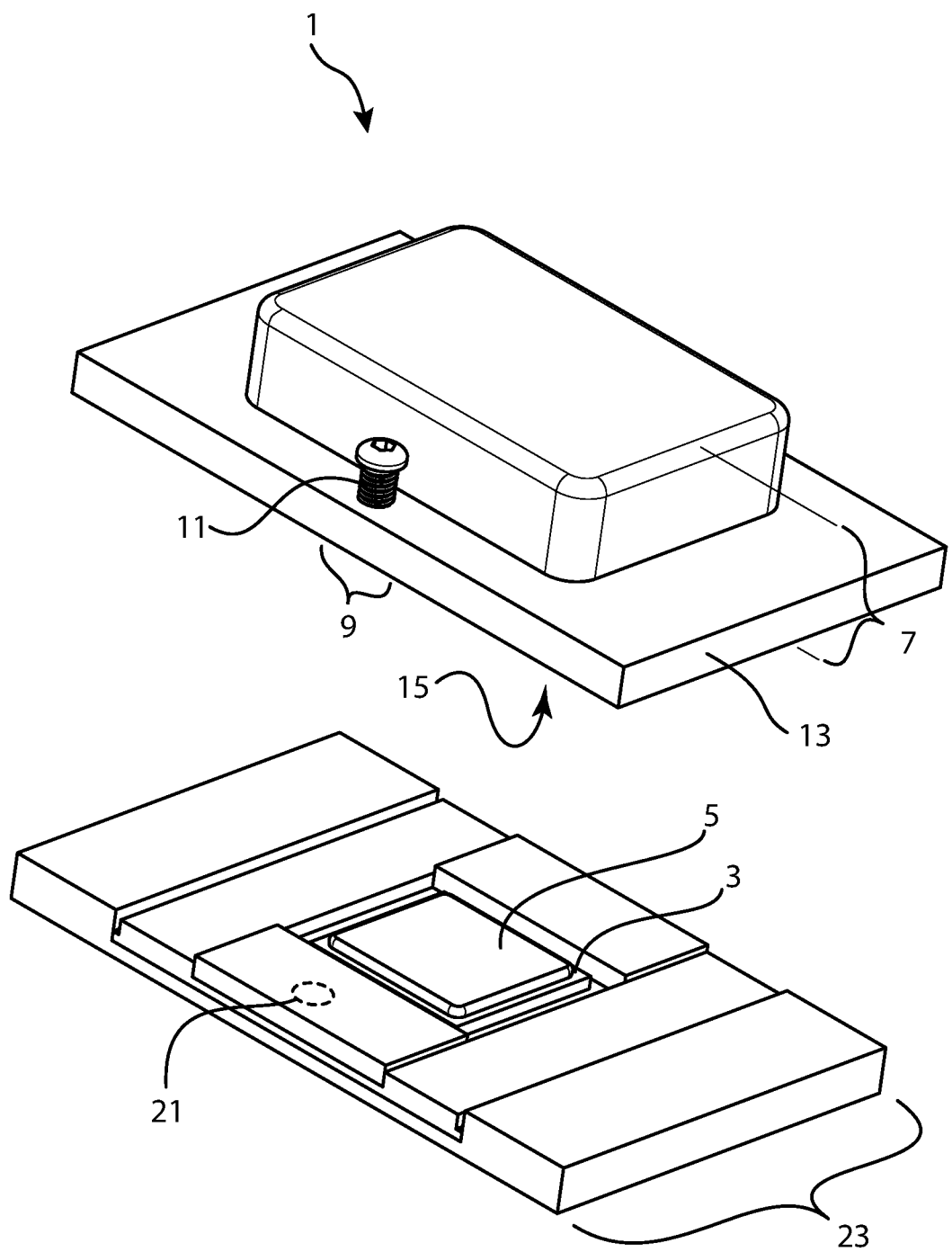
Figure 2:
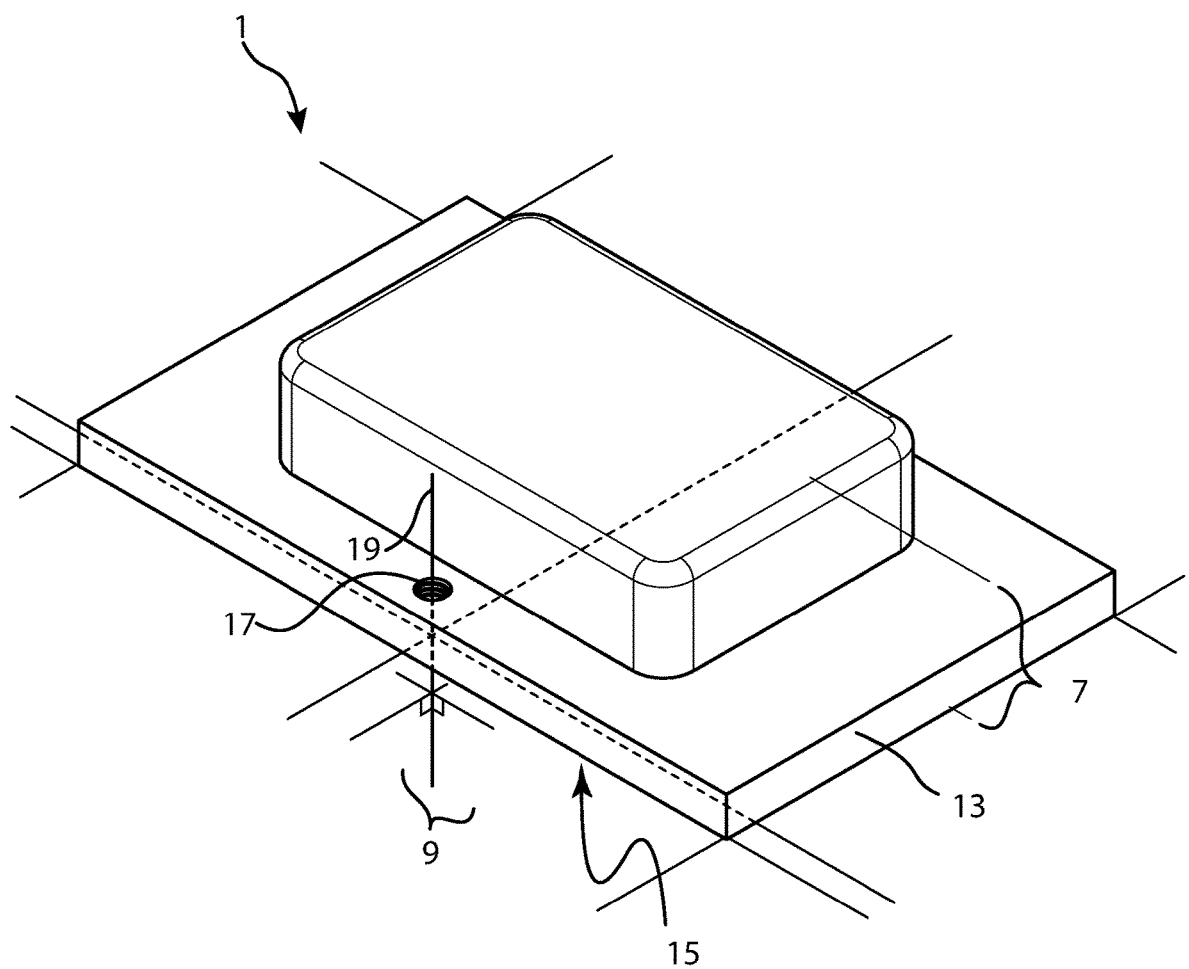
Figure 3:
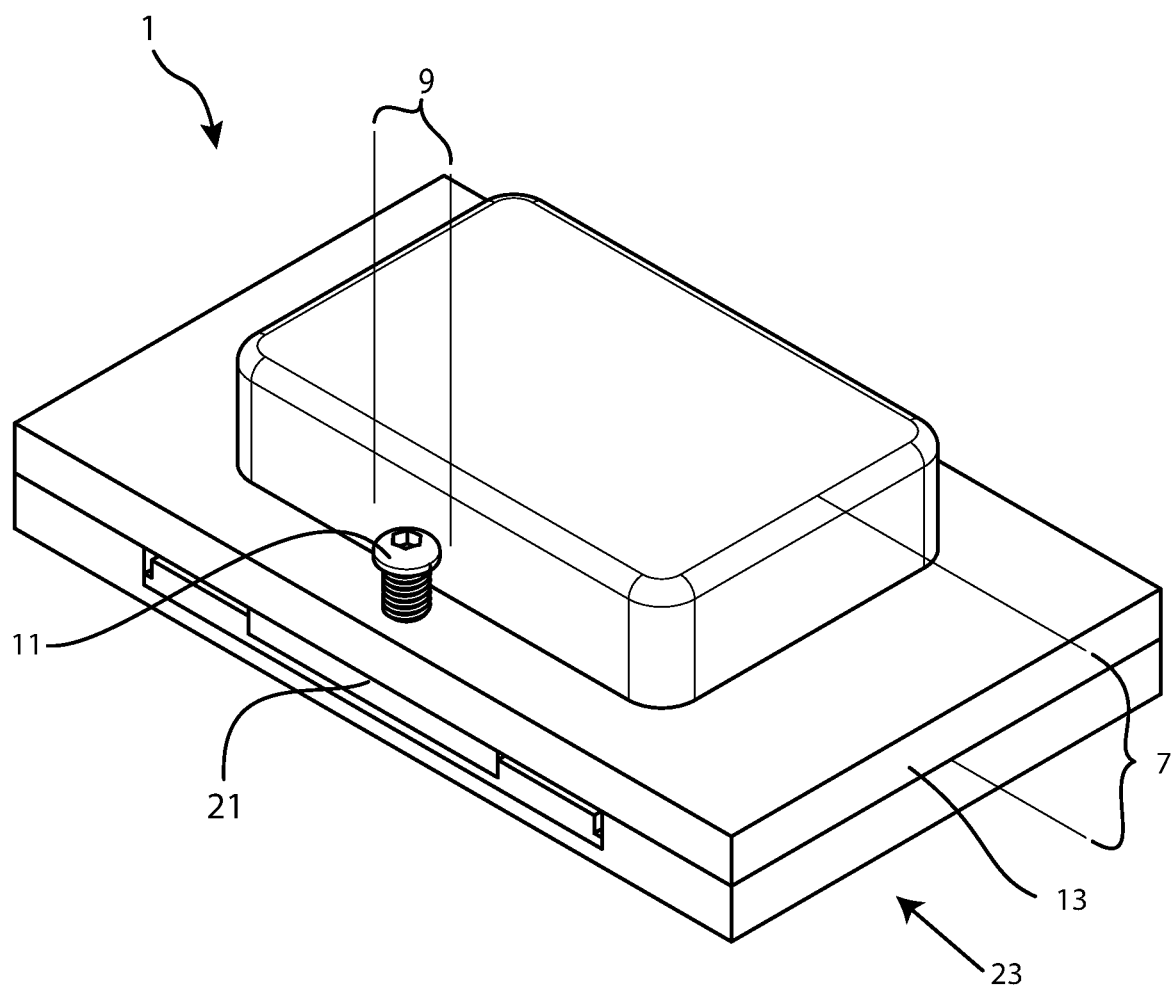
Figure 4A:
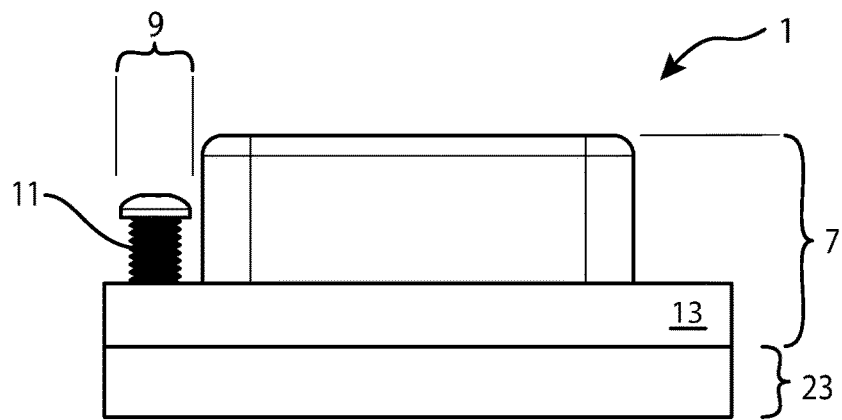
Figure 4B:
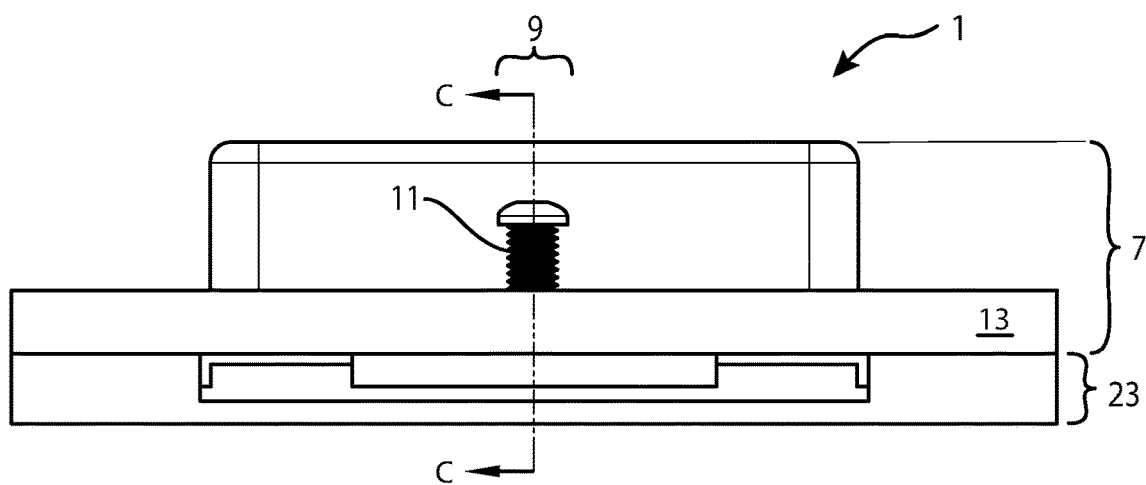
Figure 4C:
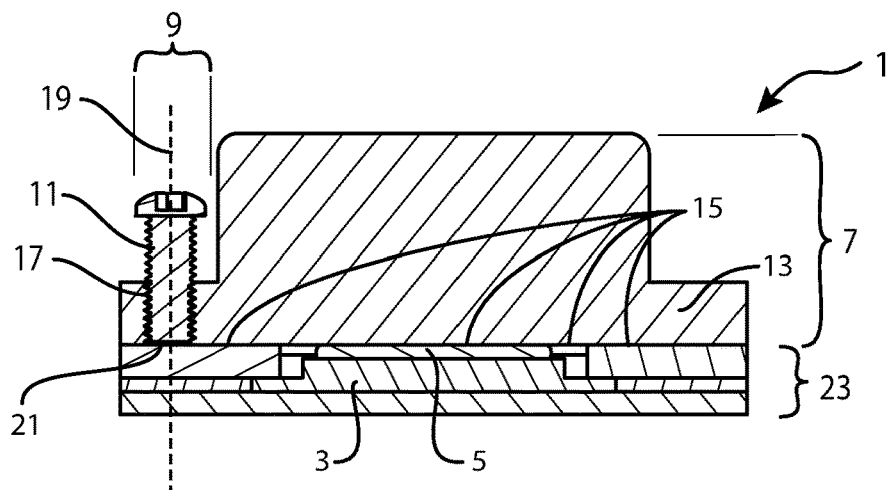
Figure 5:
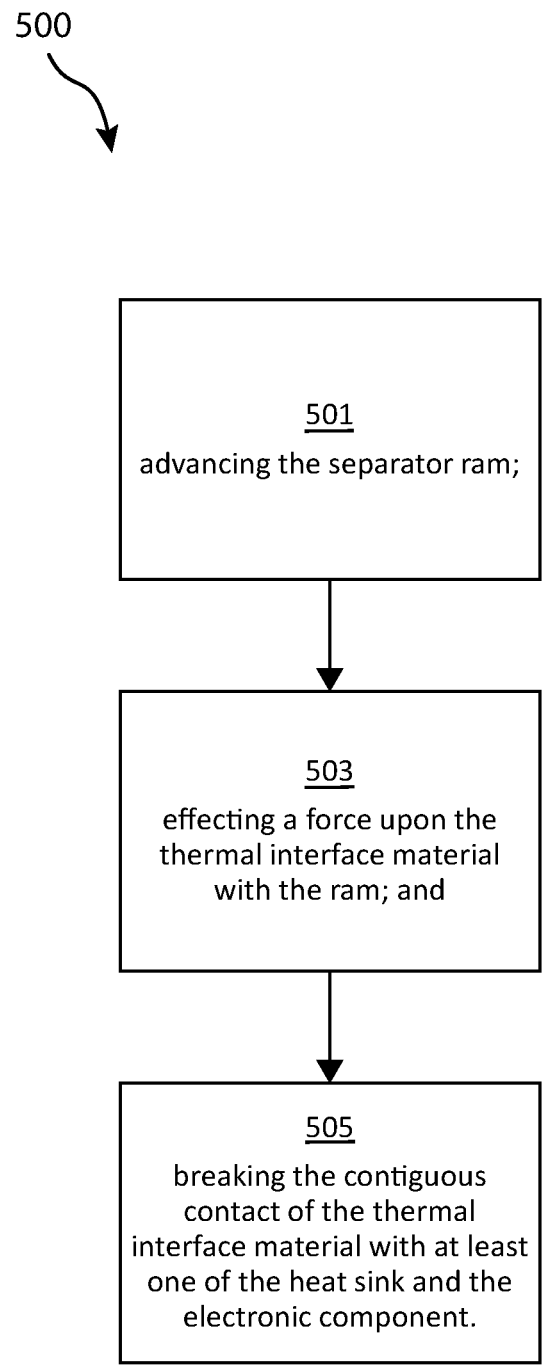
Figure 6:
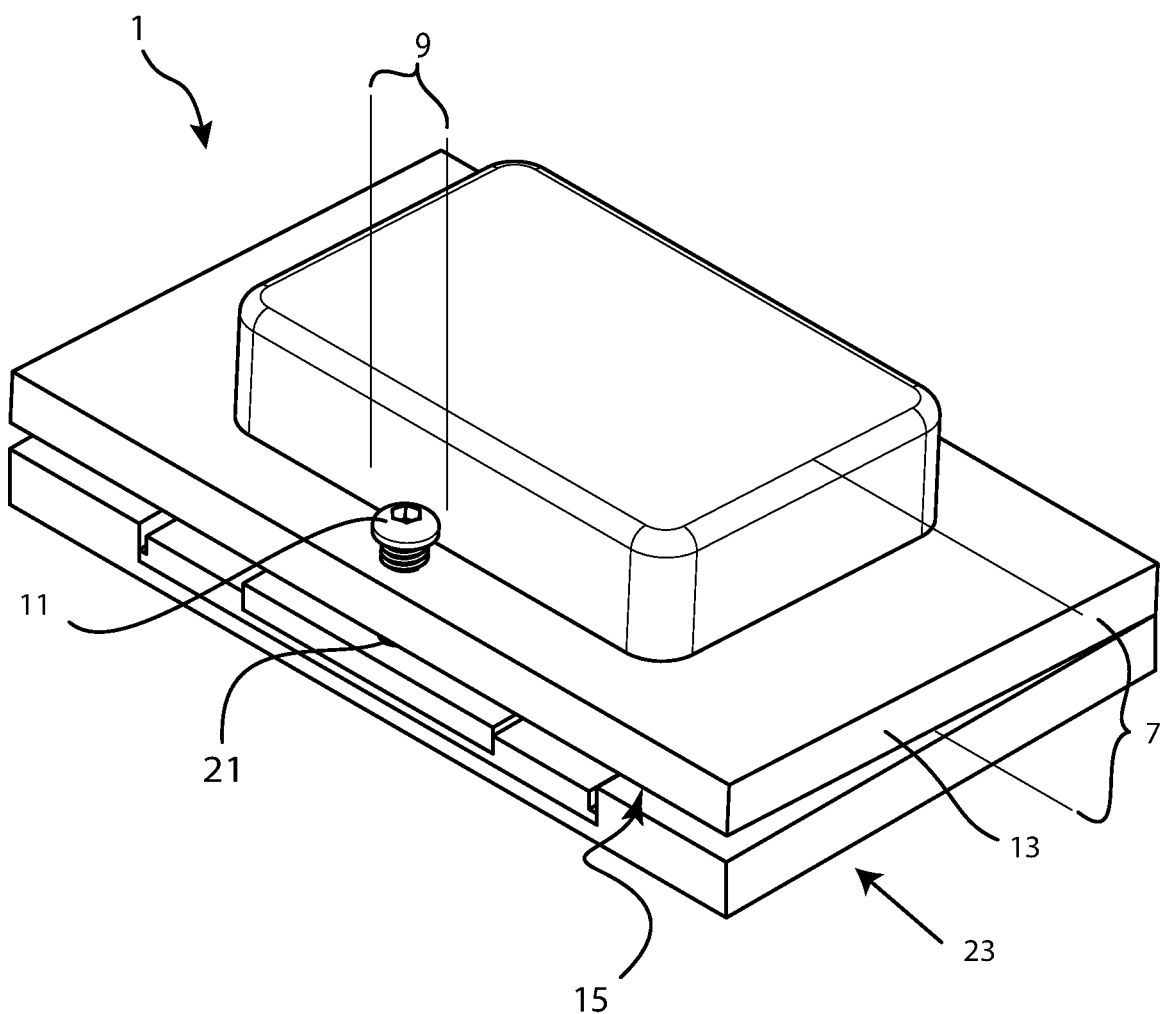
Figure 7A:
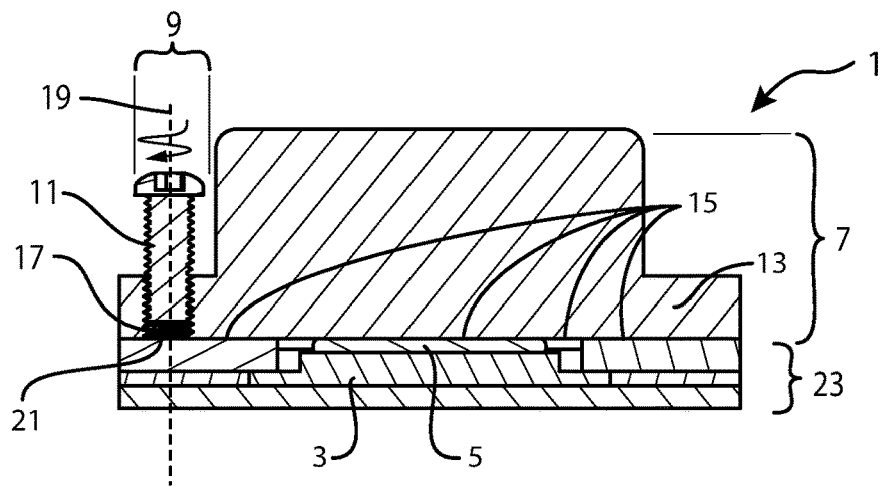
Figure 7B:
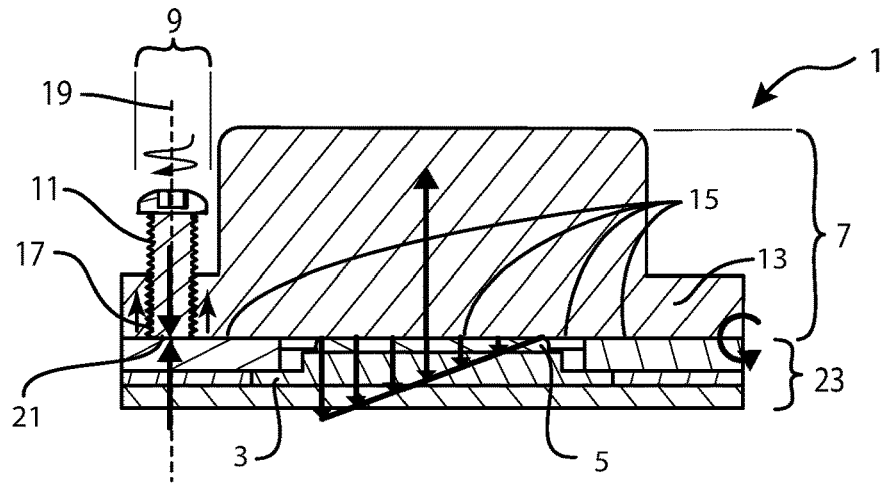
Figure 7C:
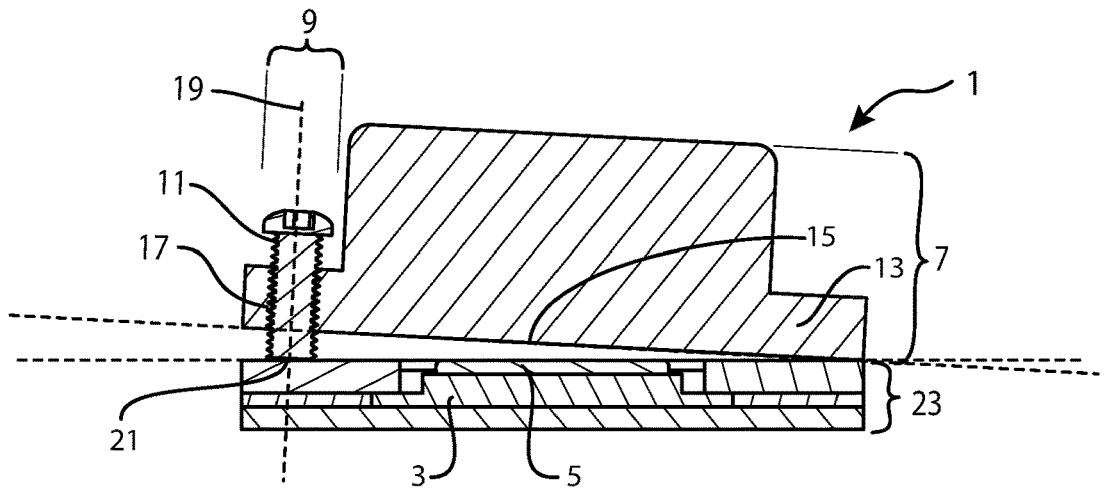
Figure 7D:
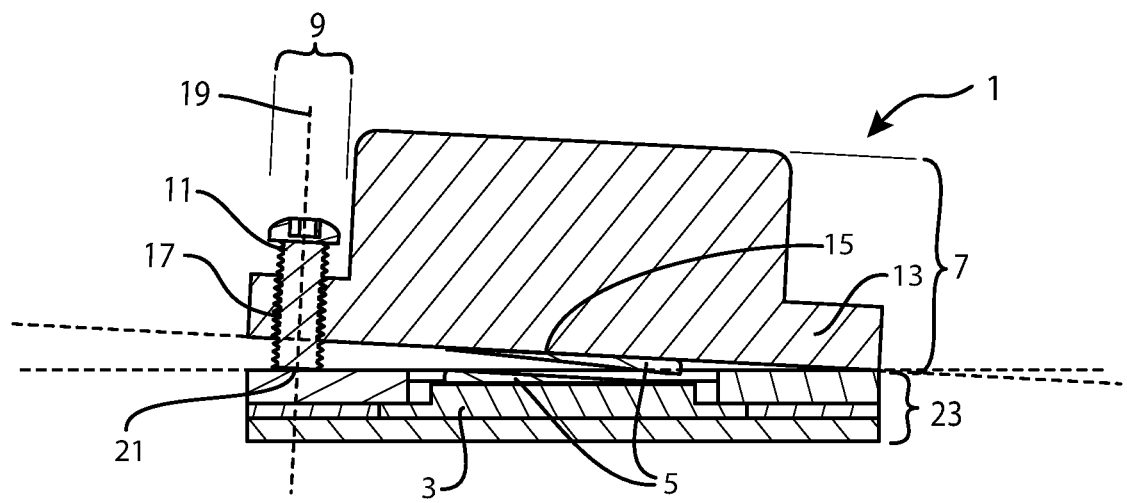
Figure 8A:
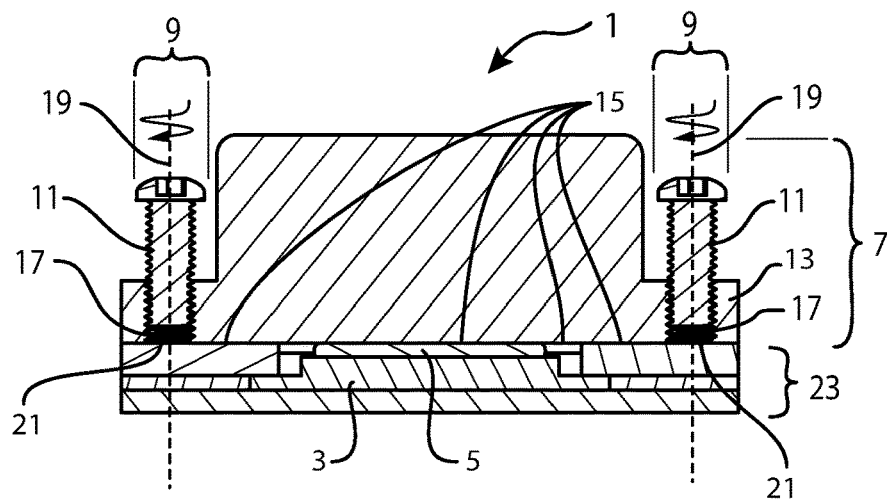
Figure 8B:
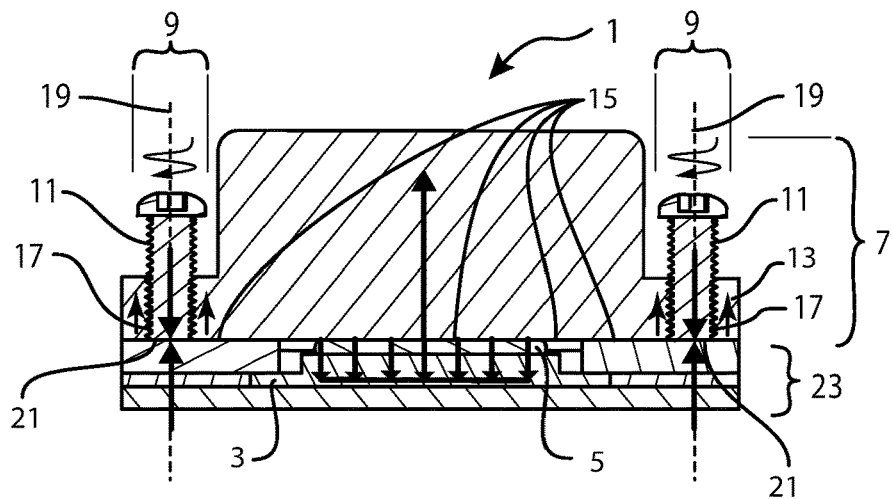
Figure 8C:
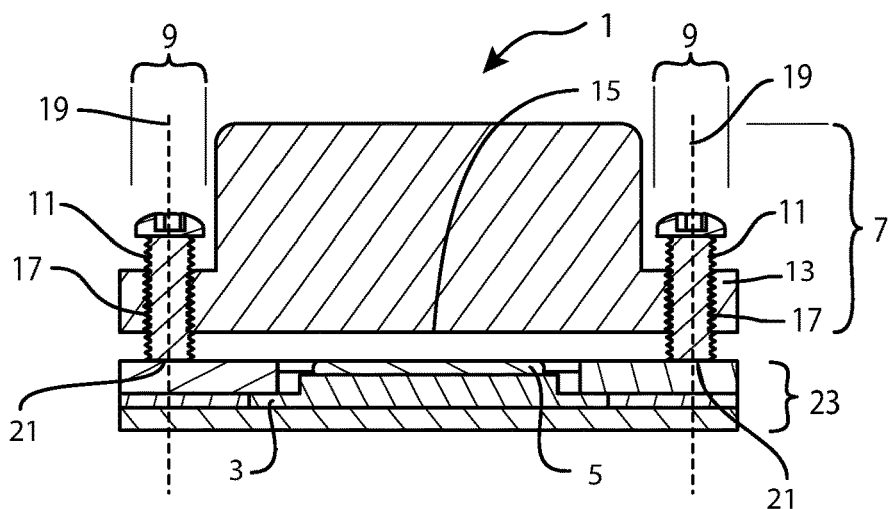
Figure 9:
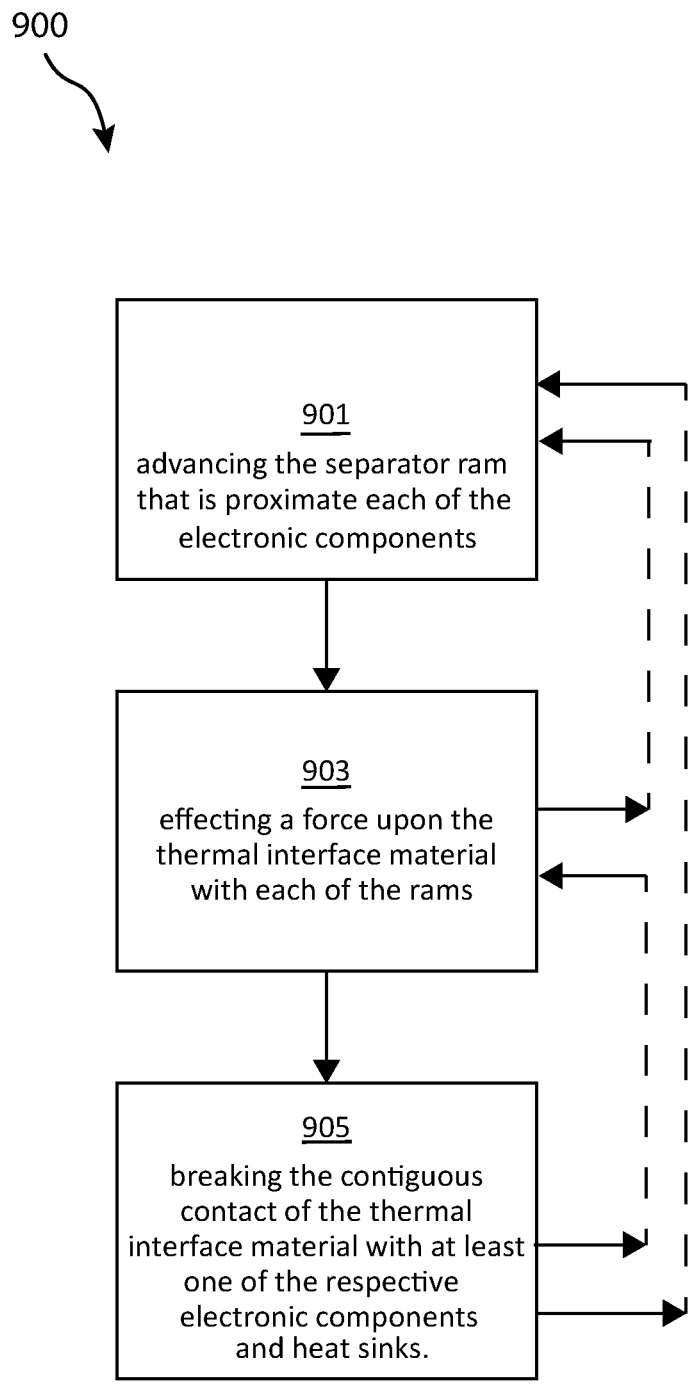
Figure 10:
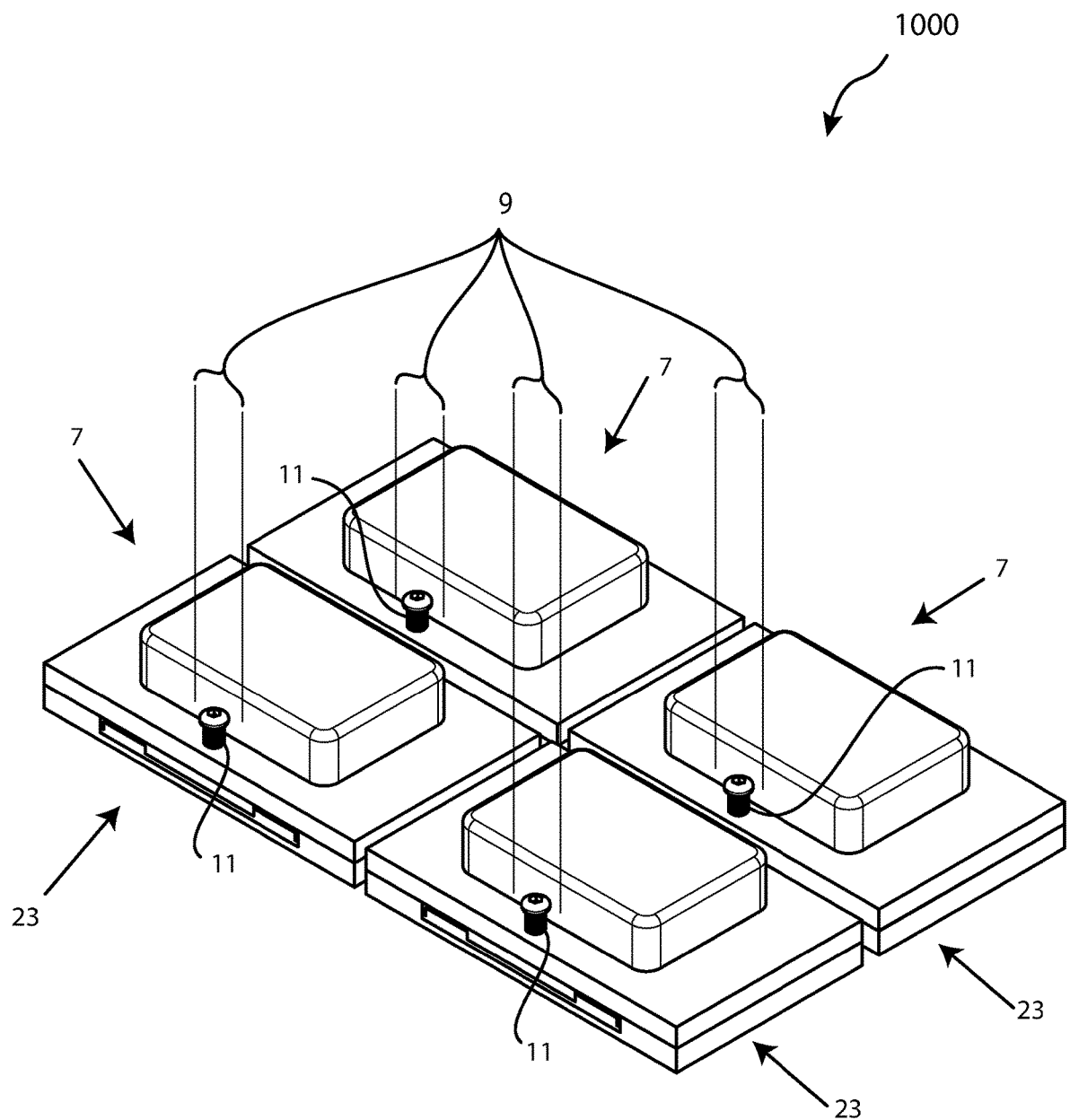
Figure 11:
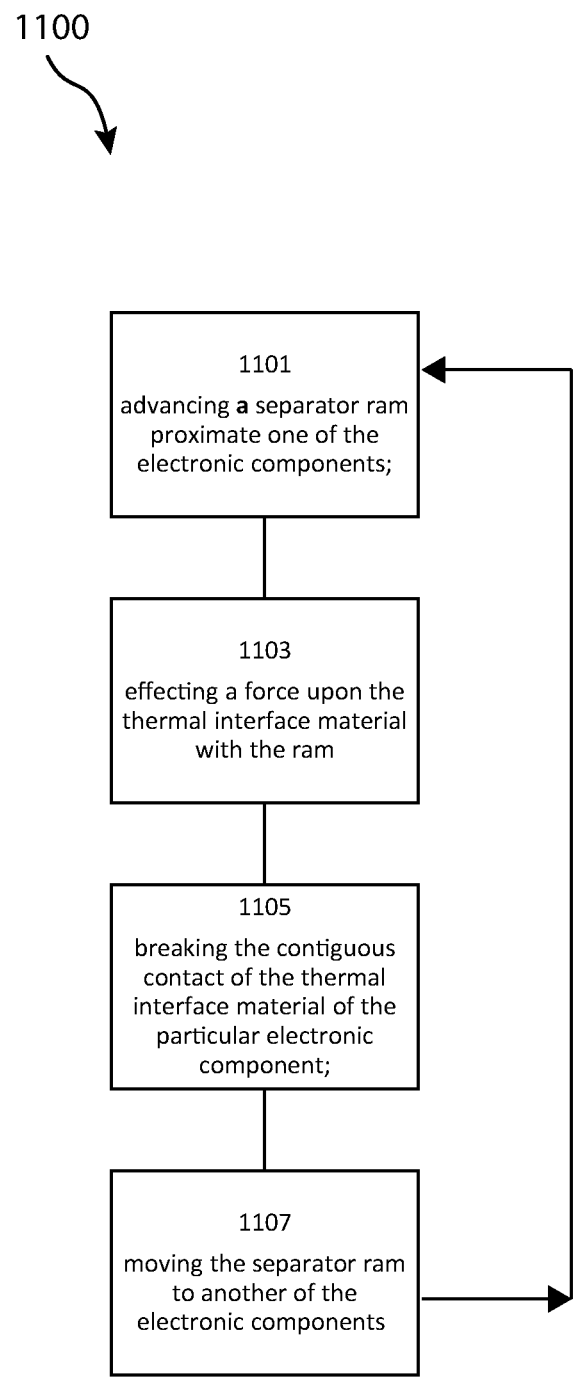
Figure 12:
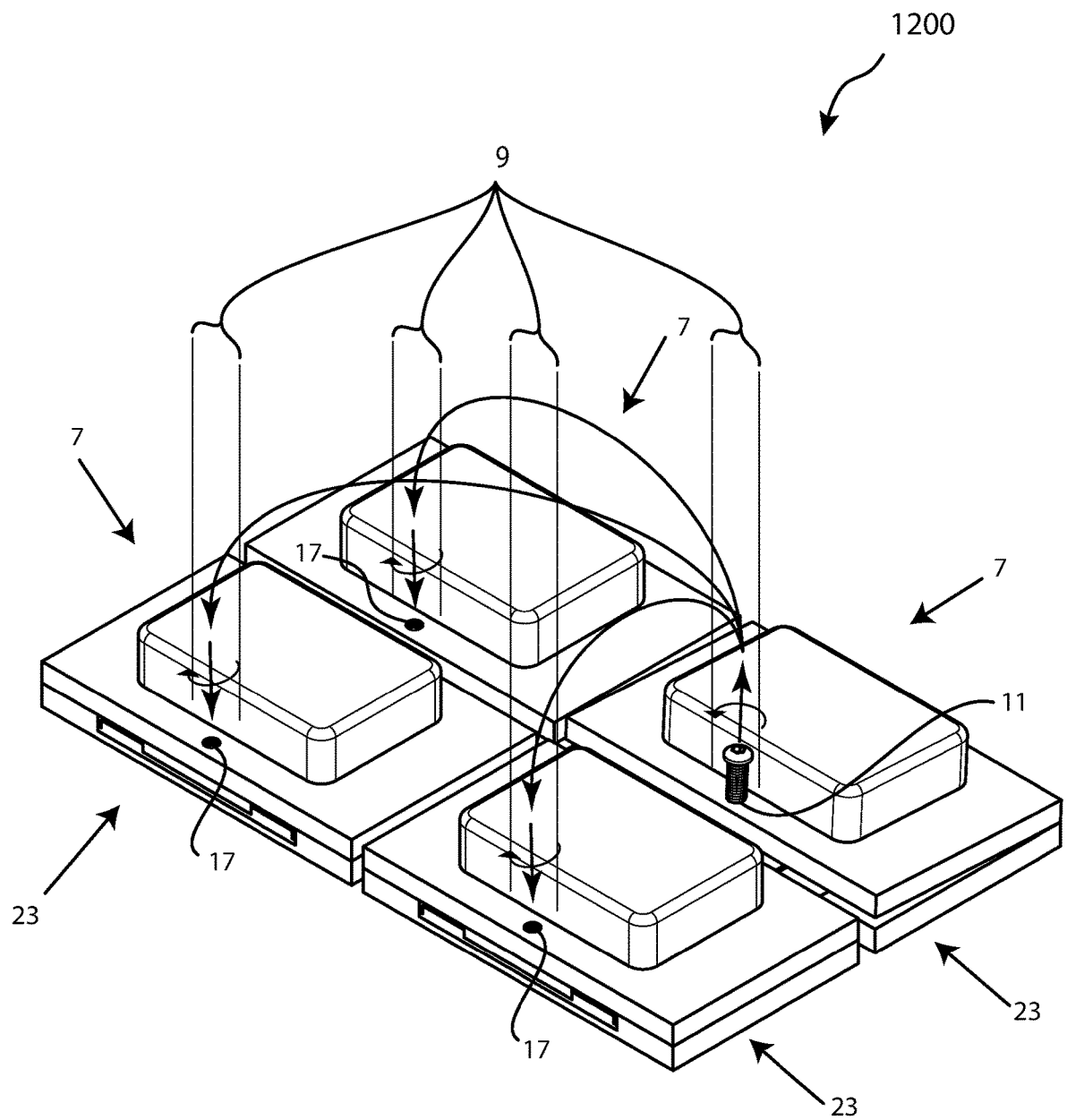

Having thus described the presently disclosed subject matter in general terms, reference will be made to the accompanying Drawings, which are not necessarily drawn to scale, and wherein:

FIG. 1 is a perspective view of a thermal interface detachment device and an electronic component retained in a fixture in accordance with embodiments of the present disclosure;

FIG. 2 is a perspective view of a thermal interface detachment device in isolation and showing a separator mechanism comprising an axis perpendicular to a contact face in accordance with embodiments of the present disclosure;

FIG. 3 is a perspective view of a thermal interface detachment device in contact with a fixture in accordance with embodiments of the present disclosure;

FIG. 4A is an elevation view of a thermal interface detachment device in contact with a fixture, in accordance with embodiments of the present disclosure;

FIG. 4B is a side elevation view of a thermal interface detachment device in contact with a fixture, in accordance with embodiments of the present disclosure;

FIG. 4C is a section view of a thermal interface detachment device in contact with a fixture, in accordance with embodiments of the present disclosure;

FIG. 5 is a flowchart of a method of detachment of a thermal interface material with a device comprising a separator ram proximate each heat sink, in accordance with embodiments of the present disclosure;

FIG. 6 is a perspective view of a thermal interface detachment device in contact with a fixture and rotated away from parallel thereto, in accordance with embodiments of the present disclosure;

FIG. 7A is a section view of a thermal interface detachment device in contact with a fixture and a thermal interface material in contiguous contact with the thermal interface detachment device and an electronic component, with a separator ram in an un-advanced orientation with respect to a separator mechanism, in accordance with embodiments of the present disclosure;

FIG. 7B is a section view of a thermal interface detachment device in contact with a fixture and a thermal interface material in contiguous contact with the thermal interface detachment device and an electronic component, with a separator ram in an advanced orientation, in contact with the fixture and effecting a force on the thermal interface material, in accordance with embodiments of the present disclosure;

FIG. 7C is a section view of a thermal interface detachment device in contact with a fixture and rotated away from parallel thereto and a thermal interface material in contact with an electronic component retained in the fixture, with a separator ram in an advanced orientation, in contact with the fixture, and separating a heat sink from the thermal interface material, in accordance with embodiments of the present disclosure;

FIG. 7D is a section view of a thermal interface detachment device in contact with a fixture and rotated away from parallel thereto, a portion of a thermal interface material in contact with an electronic component retained in the fixture, a portion of a thermal interface material in contact with a heat sink of the thermal interface detachment device, with a separator ram in an advanced orientation, in contact with the fixture, and separating the thermal interface material on the heat sink and thermal interface material on the electronic device from contiguous contact therebetween, in accordance with embodiments of the present disclosure;

FIG. 8A is a section view of a thermal interface detachment device in contact with a fixture and a thermal interface material in contiguous contact with the thermal interface detachment device and an electronic component, with two separator rams in an un-advanced orientation with respect to a separator mechanism, in accordance with embodiments of the present disclosure;

FIG. 8B is a section view of a thermal interface detachment device in contact with a fixture and a thermal interface material in contiguous contact with the thermal interface detachment device and an electronic component, with two separator rams in an advanced orientation with respect to a separator mechanism, to contact with the fixture and each effecting a force on the thermal interface material, in accordance with embodiments of the present disclosure;

FIG. 8C is a section view of a thermal interface detachment device separated away from contact with a fixture and a thermal interface material in contact with an electronic component retained in the fixture, with two separator rams in an advanced orientation with respect to a separator mechanism, in contact with the fixture, and separating the thermal interface material from contiguous contact between the heat sink and the electronic component, in accordance with embodiments of the present disclosure;

FIG. 9 is a flowchart of a method of detachment of a plurality of thermal interface materials of a plurality of electronic devices and a plurality of heat sinks with a device comprising a separator mechanism having a separator ram proximate each heat sink; in accordance with embodiments of the present disclosure;

FIG. 10 is a perspective view of a thermal interface detachment device having a plurality of heat sinks in contact with a plurality of fixtures and a separator mechanism having a plurality of separator rams that are each configured to be advanced to contact a fixture proximate an electronic component retained in the fixture to break the contiguous contact of a thermal interface material between the electronic component and the respective heat sink, in accordance with embodiments of the present disclosure;

FIG. 11 is a flowchart of a method of detachment of a plurality of thermal interface materials of a plurality of electronic devices and a plurality of heat sinks with a device comprising a separator ram that is configured to effect a force proximate each electronic device at a location proximate each heat sink;

FIG. 12 is a perspective view of a thermal interface detachment device having a plurality of heat sinks in contact with a plurality of fixtures and a separator mechanism having a separator ram that is configured to be advanced with respect to each of a plurality of bores of the separator mechanism to contact a fixture proximate an electronic component retained in the fixture to break the contiguous contact of a thermal interface material between the electronic component and the respective heat sink, and advanced in a second direction to be removed therefrom and moved to and subsequently advanced proximate each of the other bores of the separator mechanism, in accordance with embodiments of the present disclosure;

DETAILED DESCRIPTION

The following detailed description is made with reference to the figures. Exemplary embodiments are described to illustrate the disclosure, not to limit its scope, which is defined by the claims. Those of ordinary skill in the art will recognize a number of equivalent variations in the description that follows.

Articles "a" and "an" are used herein to refer to one or to more than one (i.e. at least one) of the grammatical object of the article. By way of example, "an element" means at least one element and can include more than one element.

"About" is used to provide flexibility to a numerical endpoint by providing that a given value may be "slightly above" or "slightly below" the endpoint without affecting the desired result.

The use herein of the terms "including," "comprising," or "having," and variations thereof is meant to encompass the elements listed thereafter and equivalents thereof as well as additional elements. Embodiments recited as "including," "comprising," or "having" certain elements are also contemplated as "consisting essentially of" and "consisting" of those certain elements.

Recitation of ranges of values herein are merely intended to serve as a shorthand method of referring individually to each separate value falling within the range, unless otherwise indicated herein, and each separate value is incorporated into the specification as if it were individually recited herein. For example, if a range is stated as between 1%-50%, it is intended that values such as between 2%-40%, 10%-30%, or 1%-3%, etc. are expressly enumerated in this specification. These are only examples of what is specifically intended, and all possible combinations of numerical values between and including the lowest value and the highest value enumerated are to be considered to be expressly stated in this disclosure.

Unless otherwise defined, all technical terms used herein have the same meaning as commonly understood by one of ordinary skill in the art to which this disclosure belongs.

FIG. 1 illustrates a perspective view of an exemplary thermal interface detachment device 1 and an electronic component 3 retained in a fixture 23. The device 1 comprises a heat sink 7 and a separator mechanism 9. The heat sink 7 comprises a cooling plate 13. The separator mechanism 9 is configured to receive a separator ram 11. On the electronic component 3 is a thermal interface material 5.

The heat sink 7 of FIG. 1 is configured to contact the thermal interface material 5 and is configured to heat transfer interface with the electronic component 3 while the thermal interface material 5 is in contiguous contact with both the heat sink 7 and the electronic component 3. Specifically, the electronic component 3 and heat sink 7 are generally planar, and are designed to interface in such close proximity as to define a predominant interface plane (see FIG. 2). To effect this orientation and contact, for transferring heat between the electronic component 3 and the heat sink 7, the cooling plate 13 is configured to be brought into proximity and contact the thermal interface material 5 with its contact face 15 predominantly parallel to the fixture 23 (see also FIG. 3). Thereby, with an unbroken volume or mass of thermal interface material 5 in contact with both the electronic device 3 and the heat sink 7, the thermal interface material 5 is in contiguous contact with both the electronic device 3 and the heat sink 7 (see also FIG. 3).

FIG. 1 also illustrates a target area 21 corresponding to the separator ram 11. See also FIGS. 3, 4C, 6, 7A-D, 8A-C.

The separator mechanism is configured to advance the separator ram with respect to the heat sink and effect a force upon the thermal interface material, such that advancing the ram breaks the contiguous contact of the thermal interface material with at least one of the heat sink and the electronic component.

FIG. 2 is a perspective view of a thermal interface detachment device 1, in isolation from an electronic component (3, See FIGS. 1, 7A-D, 8A-C). The separator mechanism 9 comprises an axis 19 perpendicular to a contact face 15 of a cooling plate 13 of a heat sink 7. The dotted lines crossing under the cooling plate 13 indicate lengthwise and widthwise axes perpendicular to one another and respectively parallel to the lengthwise and widthwise edges of the predominantly planar contact face 15 of the cooling plate 13, and intersect where the axis 19 of the separator mechanism provides a bore 17 and extends perpendicularly to the contact face 15.

Specifically, the bore 17 is a threaded bore configured to advance by rotation a separator ram having a commensurately threaded profile (See FIGS. 6, 7A-D, 8A-C). A threaded bore is merely exemplary of several embodiments and should be considered non-limiting on the present invention. It is merely one example of a separator mechanism of the cooling plate 13 of the heat sink 7. Other exemplary embodiments may include a separator mechanism that is merely configured to engage the cooling plate 13 and/or other portions of the heat sink 7 or other portions of the thermal interface detachment device 1.

Other exemplary and several contemplated non-limiting embodiments for a separator mechanism to advance a separator ram include linear cylinders irrespective of motivating force, such as linear motors, spring-propelled rams, lever-actuated rams, biased detents, expanding jacks and other linearizing force-orienting linkages. Such embodiments also may not require rotation. Generally common to some embodiments is that in advancement of the ram, the ram extends in a direction predominantly parallel to the axis 19 and/or perpendicular to the contact face 15 or equivalent interface geometry to the interface plane indicated by the solid lines extending from the contact face 15.

FIG. 3 is a perspective view of a thermal interface detachment device 1 in contact with a fixture 23, similar to the embodiments otherwise depicted in a spaced-apart orientation in FIG. 1. The separator ram 11 is shown in an un-advanced position with respect to the separator mechanism 9, arranged on the cooling plate 13 of the heat sink 7. The separator ram 11 comprises threaded geometry with respect to a bore having an axis (see FIG. 2) that is aligned with a target area 21 (see also FIG. 1) on the fixture 23.

FIGS. 4A, 4B, and 4C are respectively: an elevation view, a side elevation view, and a section view of a thermal interface detachment device 1 in contact with a fixture 23, similar to the embodiments illustrated in FIGS. 1-3. These views are illustrated parallel to the plane of a predominant interface plane defined by the present contact orientation of the cooling plate 13 of the heat sink 7 with the fixture 23. The separator ram 11 of FIGS. 4A-C is in an un-advanced position with respect to the separator mechanism 9.

FIG. 4C illustrates an electronic component 3 retained in a mechanically rigid fixture 23, with a thermal interface material 5 on the electronic device 3 that is also in contact with the contact face 15 of the cooling plate 13 of the heat sink 7. In this orientation, with the thermal interface material 5 unbroken and intact, it is contiguous throughout, and thereby, the heat sink 7 is in thermal interface with the electronic component 3 by the thermal interface material 5 being in contiguous contact with both the electronic component 3 and heat sink 7.

Further, in the section view of FIG. 4C, the separator ram 11 is arranged parallel to the axis 19 of the bore 17 of the separator mechanism 9, perpendicular to the contact face 15 of the cooling plate 13, and aligned with a target area 21 on a portion of the mechanically rigid fixture 23. Further, by rotation of the separator ram 11, having a threaded geometry configured to interface with the threaded bore 17 of the separator mechanism 9, the separator mechanism 9 is configured to advance the separator ram 11 with respect to the heat sink 7. When advanced by rotation through the heat sink 7, the separator ram 11 is configured to contact the target area 21, which is rigidly located with respect to the electronic component 3.

As will be described with respect to further figures, in some exemplary embodiments having similarity to that of FIGS. 1-4C, separator mechanisms 9 configured to advance a separator ram 11 in a manner similar to that of ram 11 in FIG. 4C are configured to further advance such a separator ram 11 to effect a force on a thermal interface material 5, such that advancing the ram 11 may break the contiguous contact of that thermal interface material 5 with at least one of the heat sink 7 and the electronic component 3 for which it had been in simultaneous heat conductive contact, or thermal interface.

FIG. 5 is a flowchart of a method of detachment 500 of a thermal interface material with a device comprising a separator ram proximate each heat sink. Consider this as an exemplary method compatible with, but not limited-to device embodiments in aforementioned FIGS. 1, 3, and 4A-C. For a separator ram of a separator mechanism of a heat sink in contact with a thermal interface material that is configured to thermal interface with an electronic component while the thermal interface material is in contiguous contact with both the heat sink and the electronic component, the depicted exemplary method comprises steps of: advancing the separator ram 501, effecting a force upon the thermal interface material with the ram 503, and breaking the contiguous contact of the thermal interface material with at least one of the heat sink and the electronic component 505, such that the heat sink is no longer in thermal interface with the electronic component.

FIG. 6 is a perspective view of a thermal interface detachment device 1 in contact with a fixture 23 and rotated away from parallel thereto. With respect to the aforementioned figures, the orientation of the embodiment is similar to that of FIG. 3, after execution of the steps of the method 500 in FIG. 5, Relative to the same elements in FIG. 3, the separator ram 11 is in an advanced position relative to the separator mechanism 9, and is in contact with the target area 21. In this position, the contact face 15 of the cooling plate 13 of the heat sink 7 is in contact with the fixture 23, but it has been rotated away from the fixture 23.

FIGS. 7A, 7B, 7C and 7D respectively show section views of a thermal interface detachment device 1 with respect to a fixture 23, during advancing, effecting a force, and two alternate breakings of contiguous contact of a thermal interface material. Similar to the embodiment specifically in FIG. 4C, these views are parallel to the plane of a predominant interface plane defined by the contact orientation of the cooling plate 13 of the heat sink 7 with the fixture 23.

FIGS. 7A and 7B are section views of a thermal interface detachment device 1 in contact with a fixture 23 and a thermal interface material 5 in contiguous contact with a contact face 15 of a cooling plate 13 of a heat sink 7 of the thermal interface detachment device 1 and an electronic component 3. In FIG. 7A, a separator ram 11 is in an un-advanced orientation with respect to a separator mechanism 9, but is in a step of being advanced with respect to the cooling plate 13, along the axis 19, toward reaching a target area 21 on a portion of the fixture 23 that is rigidly located, with respect to the electronic component 3.

In FIG. 7B, the separator ram 11 is in an advanced orientation with respect to the separator mechanism 9, in contact with the fixture 23. Further it is in a step of effecting a force on the thermal interface material 5.

Specifically, at the site of contact of the separator ram 11 with the fixture 23, target area 21, after rotation of the ram 11 with respect to the threaded bore 17, where further force applied to advance the ram 11 toward the fixture 23 results in an equal and opposite force in the fixture 23, the force applied effects an upward force in the separator mechanism 11, in the cooling plate 13, proximate the bore 17. The thermal interface material 5, in an adherent contact with both the cooling plate 13 and electronic device 3, has a net adherent force that is counter to forces biasing the separation of the cooling plate 13 from the electronic device 3. The separator ram 11 is thereby effecting a force in a direction opposite to the adherence force of the thermal interface material 5, and offset from the thermal interface material 5, which is located centrally, relative to the cooling plate 13.

This offset effects a moment about the edge of the contact of the cooling plate 13 with the fixture 23.

While the adherence force in the thermal interface material is at a magnitude which equals the force imposed at the bore 17, and the device 1 and fixture each define a parallel interface plane, the device 1 is held in contact with the thermal interface material with a net normal force approximately equal to the inverse of the ratio of the distances of the target area 21 and the center of the thermal interface material 5 from the aforementioned edge of contact of the cooling plate 13 with the fixture 23.

The width of the region of contact between the thermal interface material 5 and the contact face 15 allows the thermal interface material 5 to resist the net breaking force, normal to the contact face 15, with a distributed tension force. However, with increasing distance from the location of the edge of contact between the cooling plate 13 and fixture 23, there is a gradient in the magnitude of the distributed force necessary to counter the moment of resistance to separation. The difference in the tension force necessary to maintain adherence results in the imposition of a shear force across the width of the thermal interface material.

FIGS. 7C and 7D are section views of a thermal interface detachment device 1 in contact with a fixture 23 and rotated away from parallel thereto and a thermal interface material 5 in contact with an electronic component 3 retained in the fixture 23, with a separator ram 11 in an advanced orientation, in contact with the fixture 23, and separating the thermal interface material 5 from contiguous contact between the electronic device 3 and the heat sink 7. Specifically, the device 1 comprises a separator mechanism 9 having a threaded bore 17 and a separator ram 11 having threaded geometry, and has been rotated with respect to an axis 19 of the bore 17, such that the ram 11 has been advanced out of the cooling plate 13 perpendicularly from the contact face 15 of the cooling plate 13, and rotated to apply such force to a target area 21 of the mechanically rigid fixture 23 that is rigidly located with respect to the electronic component 3. In both of FIGS. 7C and 7D, the advancing of the ram, relative to the orientation in FIG. 7B, broke the contiguous contact of the thermal interface material 5 with at least one of the heat sink 7 and the electronic component 3.

Referring to FIG. 7C, the thermal interface material 5 is only in contact with the electronic device 3, and is no longer in contiguous contact because it was broken completely free of the cooling plate 13 by the net normal force resulting in a tension force that overcame the adherence force of the thermal interface material 5 with the contact face 15.

Referring to FIG. 7D, the thermal interface material 5 is broken. There is thermal interface material 5 in contact with the electronic device 3, and there is thermal interface material 5 in contact with the cooling plate 13. However, the thermal interface material 5 is no longer in contiguous contact because it was broken into distinct non-contiguous portions by the net normal force resulting in a shear force that overcame the internal forces in the thermal interface material 5 caused by maintaining adequate adherence forces at the junctions with each of the contact face 15 and the electronic device 3.

FIGS. 8A-C illustrate section views of a thermal interface detachment device 1 in contact with a fixture 23. Similar to the embodiments specifically in FIGS. 7A-D, these views are parallel to the plane of a predominant interface plane defined by the contact orientation of the cooling plate 13 of the heat sink 7 with the fixture 23. Unlike FIGS. 7A-D, the present embodiments of FIGS. 8A-C comprise a separator mechanism 9 comprising two separator rams 11. Each of these first and second separator rams 11 is configured to be advanced independently of one another. The cooling plate 13 is configured to centrally engage the thermal interface material 5 thereon, and these first and second separator rams 11 are arranged on opposite sides of the cooling plate 13, with respect to the thermal interface material 5.

Referring to FIGS. 8A and 8B, the thermal interface detachment device 1 is in contact with a fixture 23 and the thermal interface material 5 is in contiguous contact with the contact face 15 of the cooling plate 13 of the heat sink 7 and the electronic component 3.

In FIG. 8A, the separator rams 11 are in an un-advanced orientation with respect to a separator mechanism 9, but are in a step of being advanced with respect to the cooling plate 13, along axes 19 of a pair of threaded bores 17, toward reaching a pair of target areas 21 on portions of the fixture 23 that are rigidly located, with respect to the electronic component 3.

In FIG. 8B, the separator rams 11 are both in an advanced orientation with respect to the respective bores 17 of the separator mechanism 9, and both rams 11 are in contact with the fixture 23. Further, the device 1 is in a step of effecting a force on the thermal interface material 5, by further advancement of the rams 11, by rotation.

Specifically, at the site of contact of the separator rams 11 with the fixture 23, the target areas 21, the further force of advancement applied to the rams 11 results in equal and opposite forces in the fixture 23. Those forces applied effect upward force in the separator mechanism, proximate each of the bores 17. The thermal interface material 5, in an adherent contact with both the cooling plate 13 and electronic device 3, has a net adherent force that is counter to forces biasing the separation of the cooling plate 13 from the electronic device 3. The separator rams 11 are thereby each effecting a force in a direction opposite to the adherence force of the thermal interface material, and offset from the thermal interface material 5, which is located centrally, relative to the cooling plate 13.

The offset of a single, first, ram (similar to 11, FIG. 7B) effects a net moment from the force of advancement of the single separator rain. This renders a first ram 11 configured to effect rotation of the heat sink 7 in a first direction. However, the offset of a second ram 11, by offset in the opposite direction with respect to the heat sink, would effect a corresponding moment from the force of its advancement in the opposite direction as that of the first ram. Therefore, together, the first separator ram 11 and second separator ram 11 are configured to effect rotation of the heat sink 7 with respect to the electronic component 3 in opposite directions, respectively.

In the case of the embodiment in FIG. 8B, the pair of rams 11 acting to impose upward forces on opposite sides of the thermal interface material in such similar magnitude that the rams 11 effect a tension force that is distributed across the thermal interface material 5, in a direction that is normal to the contact face 15 and predominant interface plane defined by the contact of the cooling plate 13 with the fixture 23. In this orientation, this force therefore comprises a normal force, configured to separate the thermal interface material 5 from the heat sink 7.

FIG. 8C illustrates a thermal interface detachment device 1 separated away from contact with a fixture 23, and a thermal interface material 5 in contact with an electronic component 3 retained in the fixture 23, with two separator rams 11 in an advanced orientation with respect to a separator mechanism 9 that is in contact with the fixture 23. The rams 11 separate the thermal interface material 5 from contiguous contact between the heat sink 7 and the electronic component 3. This orientation is one potential outcome that follows from the force loadings depicted in FIG. 8B, where the force of adherence of the thermal interface material 5 with the contact face 15 of the cooling plate 13 yielded before an amount of force was effected upon the thermal interface material that could have effected a shear force in an amount that could have exceeded the internal adherence force limit of the thermal interface material (See the broken thermal interface material(s) 5, FIG. 7D).

A clean separation of the thermal interface material 5 from the heat sink 7 is a desirable outcome in the case of an electronic component 3 that will be replaced or otherwise discarded, following separation from the heat sink 7. While thermal interface material 5 is almost always intended to be discarded, it is sometimes not known whether an electronic component 3 cooled by a cooling plate 13 will need to be discarded, following separation.

If the electronic component 3 is in fact discovered to be faulty, having the thermal interface material entirely retained thereon, and completely broken away from the heat sink 7, allows for a replacement electronic component to be installed and a fresh thermal interface material 5 can be applied. Thereby, a minimal additional effort is necessary to clean the contact face 15 of the cooling plate 13 and ensure that the new thermal interface material 5 achieves an adequate contiguous contact to render the heat sink 7 in thermal interface with the electronic component 3.

In at least one contemplated embodiment, not depicted, where the contiguous contact is broken, but where a thermal interface material does not completely, separate from the cooling plate, or where the thermal interface material remains entirely, attached to the cooling plate by the force of separation overcoming the adherence force between the thermal interface material and the electronic component, or where the cooling plate is used as a device for removing an electronic component from a fixture, such that the thermal interface material and/or electronic component remain at least partially, attached to the device 1, a separator ram 11 may be configured to advance from a cooling plate of a heat sink at a more central location than in FIGS. 1-8C, such that the device 1 is configured to break the contiguous contact of the thermal interface material by being arranged to effect a force proximate the electronic component, to separate the electronic component from the cooling plate 13. Sufficient separation force applied with respect to the heat sink 7 and the electronic component 3 would thereby break the contiguous contact when they are separated to a sufficient distance that would necessarily one of break the thermal interface material with one of the sink and component and break the thermal interface material by overcoming its internal adherence force limit.

FIG. 9 is a flowchart of a method of detachment 900 of a plurality of thermal interface materials of a plurality of electronic components with a device comprising a plurality of heat sinks and a separator mechanism having a separator ram proximate each heat sink (See also FIG. 10). Consider this as an exemplary method compatible with, but not limited-to device embodiments in FIG. 10.

For a separator ram of a separator mechanism located in a heat sink in contact with a thermal interface material that is configured to thermal interface with an electronic component while the thermal interface material is in contiguous contact with both the heat sink and the electronic component, and wherein the heat sink is one of a plurality of heat sinks of a device in which each heat sink is configured to heat transfer interface with each of a plurality of electronic components, respectively, that each have a thermal interface material while the thermal interface materials are in contiguous contact with the respective electronic component and heat sink, the depicted exemplary method comprises several steps.

The steps comprise: advancing the separator ram 901 that is proximate each of the electronic components, respectively; effecting a force upon the thermal interface material with each of the rams 903; and breaking the contiguous contact of each of the thermal interface materials, respectively, with at least one of the respective electronic components and the respective heat sink, independently 905, such that the separator rams cumulatively break the thermal interfaces of all of the heat sinks with the electronic components.

Unlike the method 500 embodiment in FIG. 5, the present method 900 embodiment is optionally able to be practiced recursively between each of the heat sinks, because advancing 901 effecting a force 903 and breaking the contiguous contact 905 may be done sequentially for each heat sink (7, FIG. 10), or each step may be done for each heat sink before performing each step of the other heat sinks, or in partial sequence for each before performing a step on another of the heat sinks, until the separator rams cumulatively break the thermal interfaces of all of the heat sinks with the electronic components. This is represented by the dotted return loops between: 905 and 903 (breaking a thermal interface material of a heat sink before effecting a force, with respect to a heat sink that already has an advanced separator ram); 905 and 901 (breaking a thermal interface material of a heat sink before advancing a ram on another heat sink); and 903 and 901 (effecting a force, without breaking contiguous contact, with respect to a heat sink, before advancing the separator ram of another heat sink).

FIG. 10 is a perspective view of an exemplary thermal interface detachment device 1000 having a cumulative heat sink comprising a plurality of heat sinks 7 in contact with a plurality of fixtures 23 and a separator mechanism 9 having a plurality of separator rams 11 that are each configured to be advanced to contact the fixture 23 proximate an electronic component (see 3, see FIG. 1) retained in the respective fixture 23 to break the contiguous contact of a thermal interface material (see 5, see FIG. 1) between the electronic component and the respective heat sink 7.

The separator rams 11 are each in an un-advanced state, with all of the heat sinks 7 in contact with and parallel to the fixtures 23, respectively. Each of the heat sinks 7 comprise a cooling plate 13. Though not shown here, the separate heat sinks 7 may be connected to form a unified heat sink, such as by a heat pipe and/or supporting mechanical structures. In this orientation, all of the thermal interface materials are in contiguous contact with each of its respective fixtures 23 and heat sinks 7, such that all of the heat sinks 7 are in thermal interface with the electronic components, respectively. A device 1000 similar to the embodiment is useful for cooling computing devices comprising several electronic components that must be cooled individually by conductive contact, but are so close to one another as to make it difficult to separate a heat sink from an electronic component with a tool that must approach and interact with the heat sink, fixture, or thermal interface material proximate the parallel interface plane (see FIG. 2).

Specifically, the embodiment is configured to detach the device 1000 from all of the electronic components (3, see FIGS. 1, 4C, 7A-D, 8A-C) by advancement of each of the separator rams 11, relative to the separator mechanism 9, which is integral to the cooling plates 13 of the heat sinks 7. The separator rams 11 are configured to being independently advanced with respect to one another, to effect separation with a force that comprises a tension force and/or a shear force (see FIGS. 7A-D) applied to the thermal interface materials (5, see FIGS. 7A-D). However, other contemplated embodiments include ones in which the separator rams are configured to be advanced in parallel or incrementally sequentially, to effect separation with a force that comprises a tension force and/or a normal force applied to the thermal interface materials, such as in the case of heat sinks comprising a first and second separator ram per heat sink (see FIGS. 8A-C).

In the case of a unified heat sink, one comprising separate heat sinks similar to the individual heat sinks 7 in FIG. 10, but which are connected by a heat pipe and/or supporting mechanical structures, as discussed above, the unified heat sink would be separable as a single unit by advancement of the separator rams 11 for each of the individual heat sinks 7. The separator rams 11 separate the unified heat sink from a respective plurality of electronic components by each of the separator rams 11 independently effecting separation with respect to each of the electronic components respectively proximate to each of the individual heat sinks 7. Thereby, such a unified heat sink would be removable as a single unit.

With respect to the method 900, as applied to a device embodiment similar to that in FIG. 10: the ability of method 900, to facilitate alternately effecting a force 903 or advancing ram 901 at another heat sink of plurality of heat sinks of the same device, prior to breaking a thermal interface material 905 or even effecting a force at the same heat sink, is a significant distinction from the prior art methods of separation, as well as method 500. While the method 500 allows separation of heat sinks without requiring a tool to be applied from the side, where it might damage other electronic components or other objects, it is less appropriate for a device that might need to separate from several electronic components. Separating proximate each electronic component for a system having several electronic components is gentler, less likely to result in cast off pieces of thermal interface material, and prevents separation from causing any one heat sink from translating toward other electronic components.

For example, the present invention comprises embodiments that may be useful to separation of cooling systems from potentially vast computing systems having an unknown quantity of electronic devices. Some embodiments may have rigid liquid connections between many distant heat sinks. In the case of embodiments with a pair of heat sinks a relatively long distance of separation from one another, the stiffness of the rigid connections may apply an unknown amount of force upon distant heat sink while a separator ram is used to apply a force to another heat sink. In the case of thermal interface materials that may have greater elasticity than many currently practiced, such materials may require a significant distance of separation before they break. In such cases, the distance that one heat sink may have to move before detaching may damage its connections to other components. In the case of very brittle thermal interface materials, it is possible that sudden breakage at one heat sink may cause the connections to another heat sink to oscillate hard enough to either damage connections or crash into components nearby or cause it to scatter pieces of its thermal interface material.

By comparison to the present practices, such as inserting a screwdriver and twisting, there is no separation of taking up any slack in connection, apply a bit of force, check other locations for differences in force, break connections that have comparatively higher or lower adherence force, and leave in partial load some connections while applying force to other connections. The present practices only allow breaking at each site and give no opportunity to progressively and gently effect separation across a plurality of thermal interface materials, Method 900 facilitates a far more controlled and more versatile separation (as well as device embodiments similar to that of FIG. 10).

FIG. 11 is a flowchart of a method of detachment 1100 of a plurality of thermal interface materials of a plurality of electronic components with a device comprising a plurality of heat sinks with a device comprising a separator ram that is configured to effect a force proximate each electronic device at a location proximate each heat sink (see also FIG. 12), Consider this as an exemplary method compatible with, but not limited-to device embodiments in FIG. 12.

For a separator ram of a separator mechanism located in a heat sink in contact with a thermal interface material that is configured to thermal interface with an electronic component while the thermal interface material is in contiguous contact with both the heat sink and the electronic component, and wherein the heat sink is one of a plurality of heat sinks of a device in which each heat sink is configured to heat transfer interface with each of a plurality of electronic components, respectively, that each have a thermal interface material while the thermal interface materials are in contiguous contact with the respective electronic component and heat sink, the depicted exemplary method comprises several steps.

The steps comprise: advancing a separator ram 1101 that is proximate one of the electronic components; effecting a force upon the thermal interface material (proximate to the ram) with the ram 1103; breaking the contiguous contact of the thermal interface material of the particular electronic component (proximate to the ram), with at least one of the respective electronic components and the respective heat sink 1105, moving the separator ram to another of the electronic components 1107, and thereafter repeating advancing and breaking with respect to each of the thermal interface materials, respectively (return arrow from 1107 to 1101), such that the separator ram breaks the thermal interface of the heat sink with each of the electronic components.

FIG. 12 is a perspective view of an exemplary thermal interface detachment device 1200 having a cumulative heat sink comprising a plurality of heat sinks 7 in contact with a plurality of fixtures 23 and a separator mechanism 9 having a separator ram 11 that is configured to be advanced with respect to each of a plurality of bores 17 of the separator mechanism 9 to contact each fixture 23 proximate an electronic component (3, see FIG. 1) retained in the fixture 23 to break the contiguous contact of a thermal interface material (5, see FIG. 1) between the electronic component and the respective heat sink 7, and advanced in a second direction to be removed therefrom and moved to and subsequently advanced proximate each of the other bores 17 of the separator mechanism 9.

Of the four pairs of heat sinks 7 and fixtures 23, one pair is in an orientation similar to that in FIGS. 6 and 7C-D, as would result from the separator ram 11 having been advanced in a first direction, in order to break the contiguous contact of a thermal interface material (5, see FIGS. 7C-D) with a heat sink 7 and an electronic component (3, see FIGS. 7C-D). However, unlike FIGS. 6 and 7C-D, the separator ram 11 is having been advanced in a second direction, in a direction towards removal of the separator ram 11 from the bore 17 of the particular heat sink 7, of the plurality of bores 17 in the separator mechanism 9. Arcing arrows extending away from the arrow indicating the second direction of advancement show the alternative bores 17 to which the separator ram 11 may be thereafter moved. There is an arrow proximate each of these alternative bores 17 indicating how the separator ram 11 may then be advanced in a first direction, toward each of the fixtures 23, respectively.

While the embodiments have been described in connection with the various embodiments of the various figures, it is to be understood that other similar embodiments may be used, or modifications and additions may be made to the described embodiment for performing the same function without deviating therefrom. Therefore, the disclosed embodiments should not be limited to any single embodiment, but rather should be construed in breadth and scope in accordance with the appended claims.

What is claimed is:

1. A device for an electronic component having a thermal interface material, comprising:
   a heat sink configured to contact the thermal interface material and configured to heat transfer interface with the electronic component while the thermal interface material is in contiguous contact with both the heat sink and the electronic component; and
   a separator mechanism configured to advance a separator ram with respect to the heat sink and effect a force upon the thermal interface material, wherein the separator ram is configured to effect a force on the thermal interface material by being advanced from the heat sink to contact a target area that is rigidly located with respect to the electronic component,
   such that advancing the ram breaks the contiguous contact of the thermal interface material with at least one of the heat sink and the electronic component.

2. The device of claim 1, wherein the heat sink comprises a cooling plate and the separator mechanism comprises a threaded bore having an axis extending perpendicularly from a contact face of the cooling plate.

3. The device of claim 2, wherein the separator mechanism is integral to the cooling plate of the heat sink.

4. The device of claim 1, wherein the electronic component is retained in a mechanically rigid fixture, and the target area is located on a portion of the fixture.

5. The device of claim 1, wherein the force comprises a shear force configured to break the thermal interface material.

6. The device of claim 1, wherein the force comprises a tension force configured to separate the thermal interface material from the heat sink and/or the electronic component.

7. The device of claim 1, wherein the force comprises a normal force configured to separate the thermal interface material from the heat sink and/or the electronic component.

8. The device of claim 1, wherein the separator ram is configured to be alternately advanced and removed from the heat sink by rotation in a first direction and by rotation in a second direction, respectively.

9. The device of claim 1, wherein the heat sink and electronic component each comprise a predominant interface plane with the thermal interface material that are parallel to one another while in heat transfer interface and are rotated away from parallel to one another while the separator ram is advanced.

10. The device of claim 1, wherein the separator ram is a first separator ram, and the separator mechanism is further configured to advance a second separator ram, wherein each of the rams is configured to be advanced independently of one another.

11. The device of claim 10, wherein the heat sink comprises a cooling plate configured to centrally engage the thermal interface material thereon, and the first separator ram and second separator ram are arranged on opposite sides of the cooling plate, with respect to the thermal interface material.

12. The device of claim 10, wherein advancing the first separator ram and second separator ram are configured to effect rotation of the heat sink with respect to the electronic component in opposite directions, respectively.

13. The device of claim 1, wherein the heat sink is configured to heat transfer interface with a plurality of electronic components that each have a thermal interface material by contiguous contact of each thermal interface material with the heat sink and its respective electronic component, and wherein the separator mechanism is configured to advance a separator ram proximate to each of the electronic components to independently break the contiguous contact of each of the thermal interface materials, respectively.

14. The device of claim 13, wherein the device comprises a respective separator ram proximate to each of the electronic components.

15. The device of claim 13, wherein the separator mechanism is configured to alternately advance the separator ram proximate to each of the electronic components.

16. The device of claim 15, wherein the separator ram is configured to be removed and installed to the heat sink at separate locations that are proximate to each of the electronic components, respectively.

17. A method for breaking a thermal interface with an electronic component having a thermal interface material, comprising:
   advancing a separator ram with a separator mechanism of a heat sink that is in contact with the thermal interface material and which is configured to thermal interface with the electronic component while the thermal interface material is in contiguous contact with both the heat sink and the electronic component;
   effecting a force upon the thermal interface material with the separator ram to effect a force on the thermal interface material by being advanced from the heat sink to a target area that is rigidly located with respect to the electronic component; and
   breaking the contiguous contact of the thermal interface material with at least one of the heat sink and the electronic component,
   such that the heat sink is no longer in thermal interface with the electronic component.

18. The method of claim 17, wherein the heat sink is configured to heat transfer interface with a plurality of electronic components that each have a thermal interface material while the thermal interface materials are in contiguous contact with the heat sink and the respective electronic component, and further comprising:
   advancing for each of the electronic components a separator ram that is proximate each of the respective electronic components; and
   breaking the contiguous contact of each of the thermal interface materials with at least one of the respective electronic components and the heat sink, independently, such that the separator rams cumulatively break the thermal interface of the heat sink with all of the electronic components.

19. The method of claim 17, wherein the heat sink is configured to heat transfer interface with a plurality of electronic components that each have a thermal interface material while the thermal interface materials are in contiguous contact with the heat sink and the respective electronic component, and further comprising:

advancing the separator ram proximate one of the electronic components;

breaking the contiguous contact of the thermal interface material of the particular electronic component;

moving the separator ram with respect to the heat sink, such that it is proximate to another of the electronic components; and repeating advancing and breaking the thermal interface materials of each of the respective electronic components, such that the separator ram breaks the thermal interface of the heat sink with each of the electronic components.

* * * * *